United States Patent
Ohmi et al.

(10) Patent No.: US 8,551,830 B2
(45) Date of Patent: Oct. 8, 2013

(54) SEMICONDUCTOR INTEGRATED CIRCUIT SWITCH MATRIX

(75) Inventors: Tadahiro Ohmi, Miyagi (JP); Koji Kotani, Miyagi (JP); Kazuyuki Maruo, Tokyo (JP); Takahiro Yamaguchi, Tokyo (JP)

(73) Assignees: Advantest Corporation, Tokyo (JP); National University Corporation Tohoku University, Miyagi (JP)

( * ) Notice: Subject to any disclaimer, the term of this patent is extended or adjusted under 35 U.S.C. 154(b) by 1035 days.

(21) Appl. No.: 12/110,800

(22) Filed: Apr. 28, 2008

(65) Prior Publication Data

US 2008/0318370 A1    Dec. 25, 2008

Related U.S. Application Data

(62) Division of application No. 11/182,026, filed on Jul. 15, 2005, now Pat. No. 7,667,276.

(30) Foreign Application Priority Data

Jul. 16, 2004   (JP) .................................. 2004-210699

(51) Int. Cl.
*H01L 21/336* (2006.01)
*H01L 21/8234* (2006.01)

(52) U.S. Cl.
USPC ............... 438/197; 438/6; 438/142; 438/151; 438/275; 438/308; 257/132; 257/E27.002; 257/E27.013; 257/E27.026; 257/E27.029; 257/E25.006; 257/E25.01; 257/E25.018; 257/E25.03; 257/E21.532

(58) Field of Classification Search
USPC ........... 247/132, E27.002, E27.013, E27.026, 247/E27.029, E27.59, E27.06–E27.062, 247/E27.064, E25.006, E25.01, E25.013, 247/E25.018, E25.021, E25.023, E24.027, 247/E25.03, E21.532; 257/132, E27.002, 257/E27.013, E27.026, E27.029, E27.59, 257/E27.06–E27.062, E27.064, E25.006, 257/E25.01, E25.013, E25.018, E25.021, 257/E25.023, E24.027, E25.03, E21.532; 438/6, 142, 151, 197, 275, 308

See application file for complete search history.

(56) References Cited

U.S. PATENT DOCUMENTS 4,489,478 A * 12/1984 Sakurai ........................... 438/18
6,191,442 B1   2/2001 Matsufusa
(Continued)

FOREIGN PATENT DOCUMENTS

| JP | 62-131573 A | 6/1987 |
|---|---|---|
| JP | 63-054763 A | 3/1988 |

(Continued)

OTHER PUBLICATIONS

Togo et al., "Controlling Base-SiO2 Density of Low-Leakage 1.6 nm Gate-SiON for High-Performance and Highly Reliable n/pFETs", VLSI Tech., p. 81-82, 2000.*
Office Action for Japanese Application No. 2004-210699 mailed on Dec. 21, 2010 and English translation thereof, 5 pages.
Patent Abstracts of Japan, Publication No. 2001-160612, Publication Date: Jun. 12, 2001, 1 page.

(Continued)

*Primary Examiner* — Meiya Li
(74) *Attorney, Agent, or Firm* — Osha Liang LLP

(57) ABSTRACT

There is provided a small-type semiconductor integrated circuit whose circuit area is small and whose wiring length is short. The semiconductor integrated circuit is constructed in a multi-layer structure and is provided with a first semiconductor layer, a first semiconductor layer transistor formed in the first semiconductor layer, a wiring layer which is deposited on the first semiconductor layer and in which metal wires are formed, a second semiconductor layer deposited on the wiring layer and a second semiconductor layer transistor formed in the second semiconductor layer. It is noted that insulation of a gate insulating film of the first semiconductor layer transistor is almost equal with that of a gate insulating film of the second semiconductor layer transistor and the gate insulating film of the second semiconductor layer transistor is formed by means of radical oxidation or radical nitridation.

7 Claims, 19 Drawing Sheets

(56) References Cited

U.S. PATENT DOCUMENTS

| | | |
|---|---|---|
| 6,682,963 B2 | 1/2004 | Ishikawa |
| 7,067,909 B2 | 6/2006 | Reif et al. |
| 2001/0015450 A1 | 8/2001 | Sugibayashi et al. |

FOREIGN PATENT DOCUMENTS

| | | |
|---|---|---|
| JP | 63-169755 A | 7/1988 |
| JP | 02-301162 A | 12/1990 |
| JP | 05-053689 A | 3/1993 |
| JP | 2001-160612 A | 6/2001 |
| JP | 2001-230326 A | 8/2001 |
| JP | 2001-339057 A | 12/2001 |

OTHER PUBLICATIONS

Patent Abstracts of Japan, Publication No. 2001-339057, Publication Date: Dec. 7, 2001, 1 page.
Patent Abstracts of Japan, Publication No. 02-301162, Publication Date: Dec. 13, 1990, 1 page.
Patent Abstracts of Japan, Publication No. 63-169755, Publication Date: Jul. 13, 1988, 1 page.
Patent Abstracts of Japan, Publication No. 63-054763, Publication Date: Mar. 9, 1988, 1 page.
Patent Abstracts of Japan, Publication No. 62-131573, Publication Date: Jun. 13, 1987, 1 page.
Patent Abstracts of Japan, Publication No. 05-053689, Publication Date: Mar. 5, 1993, 1 page.

* cited by examiner

SEMICONDUCTOR INTEGRATED CIRCUIT SWITCH MATRIX

CROSS-REFERENCE TO RELATED APPLICATIONS

This application is a Division of U.S. application Ser. No. 11/182,026 filed on Jul. 15, 2005 now U.S. Pat. No. 7,667,276, entitled SEMICONDUCTOR INTEGRATED CIRCUIT SWITCH MATRIX as amended on Mar. 14, 2008 by OHMI, Tadahiro et al., the entire contents of which is incorporate by reference and for which priority is claimed under 35 U.S.C. §120. As in the parent U.S. application Ser. No. 11/182,026, priority is also claimed to Japanese Patent Application No. 2004-210699 filed on Jul. 16, 2004, the entire contents of which is also incorporated by reference and for which priority is claimed under 35 U.S.C. §119.

The present application claims priority from a Japanese Patent application No. 2004-210699 filed on Jul. 16, 2004, the contents of which are incorporated herein by reference.

BACKGROUND OF THE INVENTION

Field of the Invention

The present invention relates to a semiconductor integrated circuit and a manufacturing method of the semiconductor integrated circuit. More specifically, the invention relates to a semiconductor integrated circuit constructed in a multi-layer structure and to a manufacturing method of the semiconductor integrated circuit.

FIG. 1 is a section view of a MOS-type field effect transistor (hereinafter referred to as a 'MOSFET') in a conventional semiconductor integrated circuit. FIG. 2 is a plan view of the MOSFET in the conventional semiconductor integrated circuit. In FIGS. 1 and 2, the reference characters S denotes a source electrode, D denotes a drain electrode and G denotes a gate electrode. It is noted that wires connected to the gate electrode are not shown in FIGS. 1 and 2 in order to simplify the figure.

FIGS. 1 and 2 show a circuit in which four MOSFETs 100, 102, 104 and 106 are connected in a ring. In the semiconductor integrated circuit shown in FIGS. 1 and 2, the plurality of MOSFETs 100, 102, 104 and 106 are formed in a plane and are mutually connected by wires 114, 116, 118 and 120 formed in wiring layers 110 and 112.

FIG. 3 is a conceptual diagram of a conventional programmable circuit. The programmable circuit is provided with a plurality of semiconductor integrated circuits A, B, C and D and a programmable switch matrix (hereinafter referred to as 'PSM'). The plurality of semiconductor integrated circuits A, B, C and D implement their specific functions and the PSM switches connections of signal lines connected respectively to the plurality of semiconductor integrated circuits A, B, C and D, respectively, to switch the programmable circuit to a desirable configuration.

FIGS. 4, 5 and 6 show circuit configurations of the conventional PSM. The PSM is provided with six switches 130, 132, 134, 136, 138 and 140 for four signal lines for example and switches the connections of the four signal lines. When the switch 140 between the signal line connected to the semiconductor integrated circuit A and the signal line connected to the semiconductor integrated circuit C and the switch 138 between the signal line connected to the semiconductor integrated circuit B and the signal line connected to the semiconductor integrated circuit D are ON as shown in the left part of FIG. 5, the programmable circuit operates as a circuit having a configuration as shown in the right part of FIG. 5. When the switch 130 between the signal line connected to the semiconductor integrated circuit A and the signal line connected to the semiconductor integrated circuit B and the switch 134 between the signal line connected to the semiconductor integrated circuit C and the signal line connected to the semiconductor integrated circuit D are ON as shown in the left part of FIG. 6, the programmable circuit operates as a circuit having a configuration as shown in the right part of FIG. 6. See Japanese Patent Laid-Open No. 5-53689.

FIG. 7 is a diagrammatic plan view of the PSM having eight input/outputs. The eight-input/outputs PSM is provided with 28 MOSFETs as switches for eight signal lines and mutually switches connections among the eight signal lines. Therefore, because the MOSFETs are disposed in a plane in the conventional semiconductor integrated circuit as shown in FIGS. 1 and 2, there has been a problem that a circuit area becomes very large in implementing a complicated circuit by using a large number of MOSFETs.

Accordingly, it is an object of the invention to provide a semiconductor integrated circuit that is capable of solving the above-mentioned problem and to provide a method for manufacturing the semiconductor integrated circuit. This object may be achieved through the combination of features described in independent claims of the invention. Dependent claims thereof specify preferable embodiments of the invention.

SUMMARY OF INVENTION

According to a first aspect of the invention, a semiconductor integrated circuit constructed in a multi-layer structure is provided with a first semiconductor layer, a first semiconductor layer transistor formed in the first semiconductor layer, a wiring layer which is deposited on the first semiconductor layer and in which metal wires are formed, a second semiconductor layer deposited on the wiring layer and a second semiconductor layer transistor formed in the second semiconductor layer.

Insulation of a gate insulating film of the first semiconductor layer transistor may be almost equal to that of a gate insulating film of the second semiconductor layer transistor.

The gate insulating film of the second semiconductor layer transistor may be formed by means of radical oxidation or radical nitridation.

Operating speed of the first semiconductor layer transistor may be faster than that of the second semiconductor layer transistor.

Preferably, at least a part of the first semiconductor layer transistor overlaps with the second semiconductor layer transistor in the direction from the first semiconductor layer transistor to the second semiconductor layer transistor.

The semiconductor integrated circuit may be a switch matrix for switching connections among a plurality of signal lines and the first and second semiconductor layer transistors may switch any one of the connections of the plurality of signal lines.

The first semiconductor layer transistor may transmit analog signals and the second semiconductor layer transistor may transmit digital signals.

The semiconductor integrated circuit may be further provided with a third semiconductor layer deposited on the second semiconductor layer and a third semiconductor layer transistor formed in the third semiconductor layer, wherein insulation of a gate insulating film of the third semiconductor layer transistor may be almost equal to that of the gate insulating film of the second semiconductor layer transistor.

The gate insulating film of the third semiconductor layer transistor may be formed by means of radical oxidation or radical nitridation.

The second semiconductor layer transistor and the third semiconductor transistor may be formed through an identical process by using the same photo-mask.

According to a second aspect of the invention, a manufacturing method of a semiconductor integrated circuit constructed in a multi-layer structure, includes steps of forming a first semiconductor layer transistor in a first semiconductor layer, depositing a second semiconductor layer on the first semiconductor layer and forming a second semiconductor layer transistor in the second semiconductor layer. Wherein the step for forming the second semiconductor layer transistor includes steps of forming a source electrode and a drain electrode in the second semiconductor layer, forming a gate insulating film in the second semiconductor layer by means of radical oxidation or radical nitridation and forming a gate electrode in the second semiconductor layer.

It is noted that the summary of the invention described above does not necessarily describe all necessary features of the invention. The invention may also be a sub-combination of the features described above.

Thus, the invention can provide the small-type semiconductor integrated circuit whose circuit area is small and whose wiring length is short.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 8:
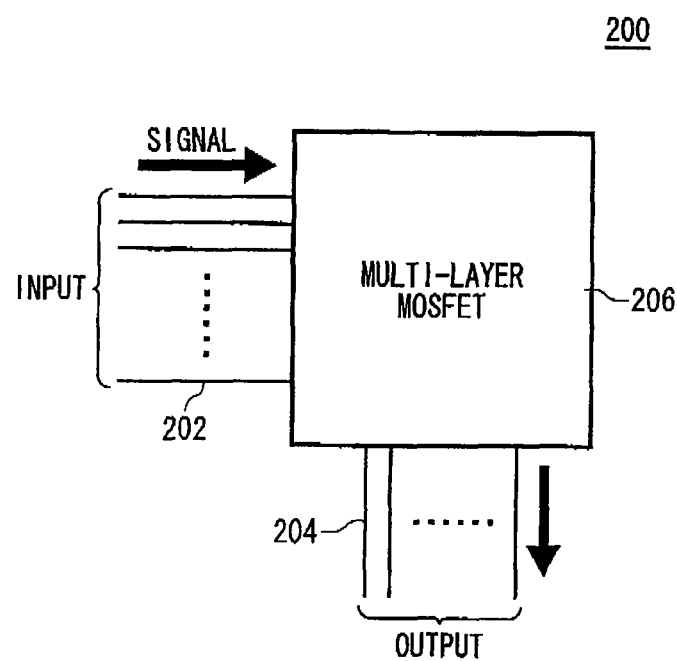
FIG. 8 shows a configuration of a semiconductor integrated circuit according to a first embodiment of the invention.
Figure 9:
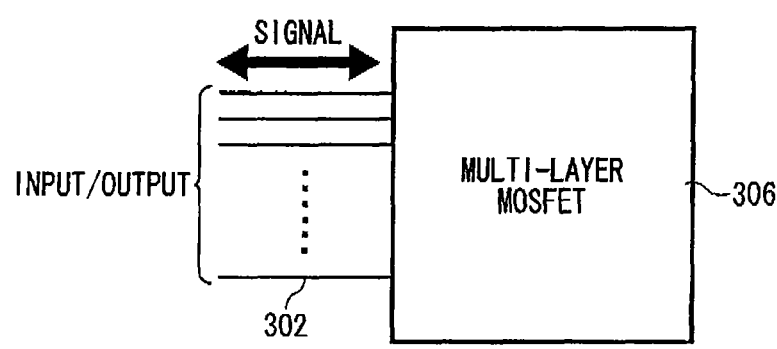
FIG. 9 shows a configuration of a semiconductor integrated circuit according to a second embodiment of the invention.

FIG. 8 shows one exemplary configuration of a semiconductor integrated circuit 200 according to a first embodiment of the invention. The semiconductor integrated circuit 200 is provided with a plurality of input signal lines 202, a plurality of output signal lines 204 and a multi-layer MOSFET 206. The multi-layer MOSFET 206 is constructed in a multi-structure and realizes predetermined functions or programmable functions by mutually switching connections among the plurality of input signal lines 202 and the plurality of output signal lines 204 by the MOSFETs provided in each layer. Because the circuit area of the semiconductor integrated circuit 200 may be reduced by stacking and integrating the MOSFETs in one chip, its chip area and wiring amount may be reduced FIG. 9 shows another exemplary configuration of the semiconductor integrated circuit 300 according to a second embodiment of the invention. The semiconductor integrated circuit 300 is provided with a plurality of input/output signal lines 302 and a multi-layer MOSFET 306. The multi-layer MOSFET 306 is constructed in the multi-layer structure and realizes the predetermined functions or the programmable functions by mutually switching connections among the plurality of input/output signal lines 302 by means of the MOSFETs provided in each layer. That is, one signal line may function as the input and output signal lines.

Figure 10:
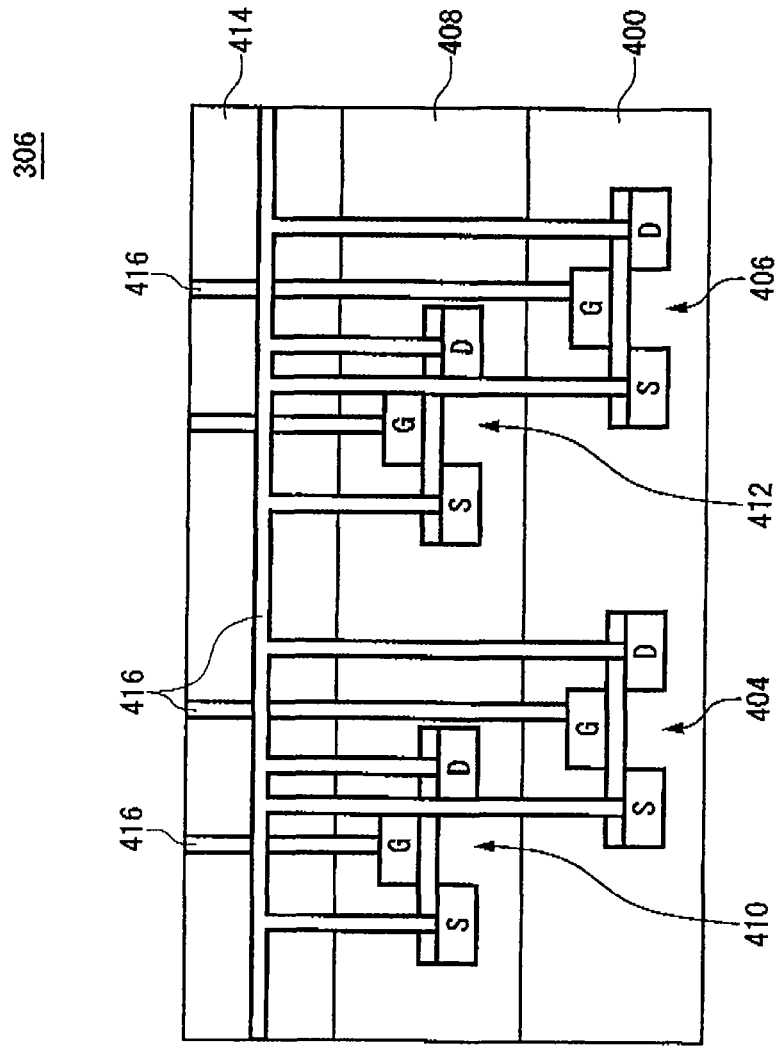
FIG. 10 is a diagrammatic section view of a multi-layer MOSFET of the second embodiment.

FIG. 10 is a diagrammatic section view of one exemplary configuration of the multi-layer MOSFET 306 of the second embodiment. It is noted that the configuration of the multi-layer MOSFET 206 of the first embodiment is the same with that of the multi-layer MOSFET 306 of the second embodiment.

The multi-layer MOSFET 306 is provided with a first semiconductor layer 400 formed out of monocrystalline silicon, a plurality of MOSFETs 404 and 406 formed in the first semiconductor layer 400, a second semiconductor layer 408, i.e., an upper layer of the first semiconductor layer 400, formed out of polycrystalline silicon, a plurality of MOSFETs 410 and 412 formed in the second semiconductor layer 408 and a wiring layer 414 which is the upper layer of the second semiconductor layer 408. The MOSFETs 404 and 406 are one example of a first semiconductor layer transistor of the invention and the MOSFETs 410 and 412 are one example of a second semiconductor layer transistor of the invention.

Source electrodes, drain electrodes and gate electrodes of the MOSFETs 404 and 406 formed in the first semiconductor layer 400 and those of the MOSFETs 410 and 412 formed in the second semiconductor layer 408 are connected to each other or to the outside via wires 416 formed in the wiring layer 414. The wires 416 connected to the MOSFETs 404 and 406 formed in the first semiconductor layer 400 are connected to the wiring layer 414 through via-holes formed through the second semiconductor layer 408. Preferably, at least a part of the MOSFET 404 or 406 overlaps with the MOSFETs 410 and 412 in the direction from the first semiconductor layer 400 to the second semiconductor layer 408. It allows the circuit area of the multi-layer MOSFET 306 to be reduced.

Next, a manufacturing method of the multi-layer MOSFET 306 will be explained. The first semiconductor layer 400 is formed at first and then the MOSFETs 404 and 406 are formed in the first semiconductor layer 400. In forming the MOSFETs 404 and 406 in the first semiconductor layer 400, a gate insulating film is formed by means of thermal oxidation. Next, the second semiconductor layer 408 is deposited on the first semiconductor layer 400 and the MOSFETs 410 and 412 are formed in the second semiconductor layer 408. In forming the MOSFETs 410 and 412 in the second semiconductor layer 408, a gate insulating film is formed by means of radical oxidation or radical nitridation. Next, the wiring layer 414 containing the wires 416 is formed.

The high-performance multi-layer MOSFET 306 may be fabricated by forming the gate insulating film of the first semiconductor layer 400 by means of the thermal oxidation and the gate insulating film of the second semiconductor layer 408 by means of the radical oxidation or the radical nitridation as described above. That is, the multi-layer MOSFET 306 may not be formed by forming the gate insulating film of the second semiconductor layer 408 by means of thermal oxidation which is a high-temperature (800° C.) process because the wires, e.g., wires formed out of aluminum whose melting point is 660° C., formed in the first semiconductor layer 400 melt. It is noted that although it is conceivable to form the wires by poly-silicon or the like whose melting point is high in the first semiconductor layer 400, the performance of the multi-layer MOSFET 306 drops because resistance of the wires become high. Then, forming the gate insulating film in the second semiconductor layer 408 by means of the radical oxidation or the radical nitridation of low electron temperature plasma (400° C.) allows the high performance multi-layer MOSFET 306 to be formed because the wires in the first semiconductor layer 400 may be formed out of metal such as aluminum whose resistance is low.

Insulation of the gate insulating film of the MOSFETs 404 and 406 is almost equal to that of the gate insulating film of the MOSFETs 410 and 412 even if the gate insulating film of the first semiconductor layer 400 is formed by means of the thermal oxidation and the gate insulating film of the second semiconductor layer 408 is formed by means of the radial oxidation or the radial nitridation.

Meanwhile, when the insulation of the gate insulating film of the MOSFETs 404 and 406 becomes higher than that of the gate insulating film of the MOSFETs 410 and 412 by forming the gate insulating film in the first semiconductor layer 400 by means of the thermal oxidation and forming the gate insulating film in the second semiconductor layer 408 by means of the radical oxidation or the radical nitridation, the MOSFETs 404 and 406 may be made smaller than the MOSFETs 410 and 412 in order to unify electric characteristics of the MOSFETs 404 and 406 with that of the MOSFETs 410 and 412. In this case, gate voltage of the MOSFETs 404 and 406 is smaller than that of the MOSFETs 410 and 412 and working speed of the MOSFETs 404 and 406 is higher than that of the MOSFETs 410 and 412.

Then, the multi-layer MOSFET 306 may be operated effectively as a whole by operating the MOSFETs 404 and 406 or the MOSFETs 410 and 412 in accordance to their performance by discriminating signals to be transmitted between the MOSFETs 404 and 406 or between the MOSFETs 410 and 412, as follows. For instance, the MOSFETs 404 and 406 whose gate insulating film is formed by means of the thermal oxidation transmit high-frequency signals whose frequency is higher than predetermined frequency and the MOSFETs 410 and 412 whose gate insulating film is formed by means of the radical oxidation or the radical nitridation transmit low-frequency signals whose frequency is lower than the predetermined frequency. In another case, the MOSFETs 404 and 406 whose gate insulating film is formed by means of the thermal oxidation transmit analog signals and the MOSFETs 410 and 412 whose gate insulating film is formed by means of the radical oxidation or the radical nitridation transmit digital signals. It becomes possible to prevent the drop of the performance of the multi-layer MOSFET 306 which is otherwise caused by the drop of performance of the MOSFETs formed by means of the radical oxidation or the radical nitridation by inputting/outputting the different types of signals corresponding to the different performances of the MOSFETs depending on whether the gate insulating films have been formed by the thermal oxidation and the radical oxidation or the radical nitridation.

Figure 11:
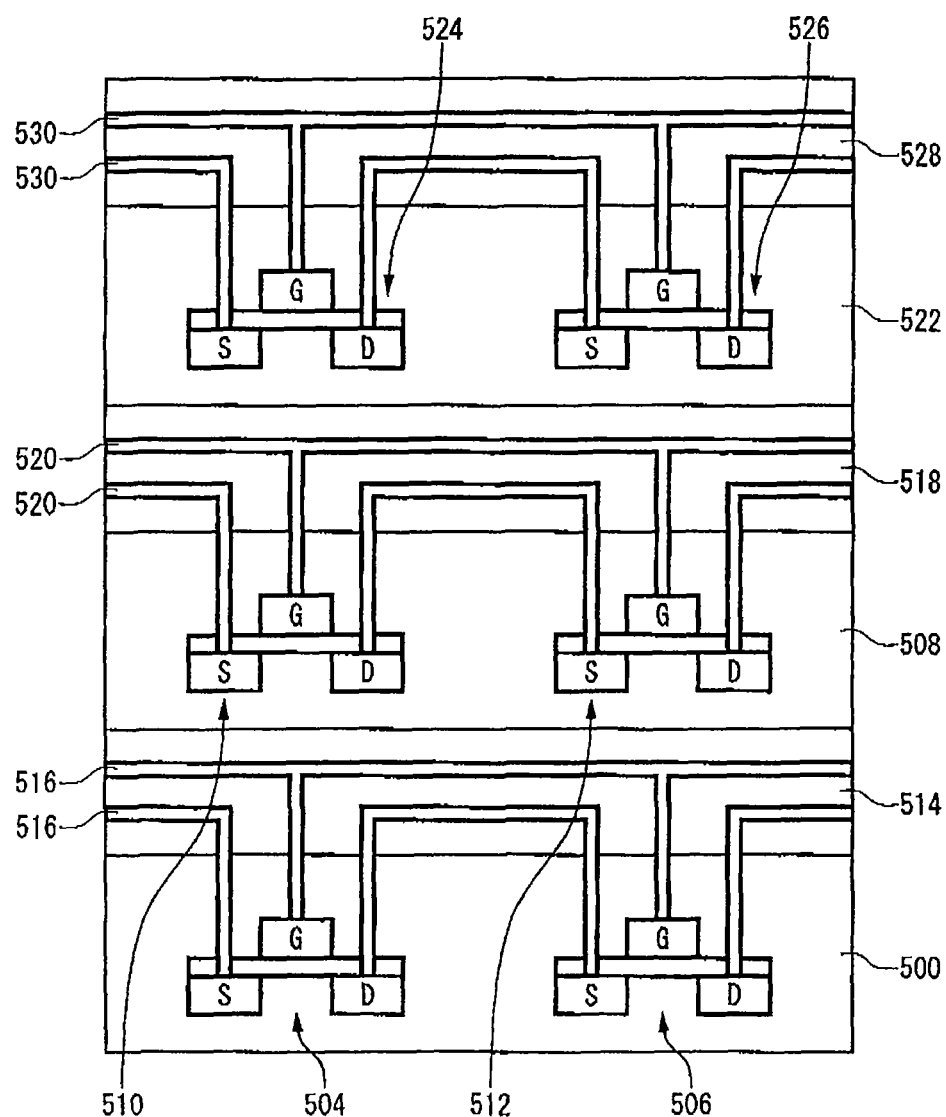
FIG. 11 is a diagrammatic section view of the multi-layer MOSFET of the second embodiment.

FIG. 11 is a diagrammatic section view of one exemplary configuration of the multi-layer MOSFET 306 of the second embodiment. It is noted that the configuration of the multi-layer MOSFET 206 of the first embodiment is the same with that of the multi-layer MOSFET 306 of the second embodiment.

The multi-layer MOSFET 306 is provided with a first semiconductor layer 500 formed out of monocrystalline silicon, a plurality of MOSFETs 504 and 506 formed in the first semiconductor layer 500, a second semiconductor layer 508, i.e., the upper layer of the first semiconductor layer 500, formed out of polycrystalline silicon, a plurality of MOSFETs 510 and 512 formed in the second semiconductor layer 508, a third semiconductor layer 522, i.e., the upper layer of the second semiconductor layer 508, formed out of polycrystalline silicon, a plurality of MOSFETs 524 and 526 formed in the third semiconductor layer 522, a wiring layer 514 provided between the first semiconductor layer 500 and the second semiconductor layer 508, a wiring layer 518 provided between the second semiconductor layer 508 and the third semiconductor layer 522 and a wiring layer 528 which is the upper layer of the third semiconductor layer 522. The MOSFETs 504 and 506 are one example of the first semiconductor layer transistor of the invention, the MOSFETs 510 and 512 are one example of the second semiconductor layer transistor of the invention and the MOSFETs 524 and 526 are one example of the third semiconductor layer transistor.

Metal wires 516 for connecting the MOSFETs 504 and 506 formed in the first semiconductor layer 500 with the MOSFET 510, 512, 524 or 528 or with the outside are formed in the wiring layer 514. Metal wires 520 for connecting the MOSFETs 510 and 512 formed in the second semiconductor layer 508 with the MOSFET 504, 506, 524 or 526 or with the outside are formed in the wiring layer 518. Metal wires 530 for connecting the MOSFETs 524 and 526 formed in the third semiconductor layer 522 with the MOSFET 504, 506, 510 or 512 or with the outside are formed in the wiring layer 528. Preferably, at least a part of the MOSFET 504 or 506 overlaps with the MOSFET 510 and 512 in the direction from the first semiconductor layer 500 to the second semiconductor layer 508 and at least a part of the MOSFET 510 or 512 overlaps with the MOSFETs 524 and 526 in the direction from the second semiconductor layer 508 to the third semiconductor layer 522. Still more, the MOSFET 504 or 506 and the MOSFETs 510, 512, 524 and 526 may be formed in the identical position in the second semiconductor layer 508 or in the third semiconductor layer 522. It allows the circuit area of the multi-layer MOSFET 306 to be reduced.

Next, a manufacturing method of the multi-layer MOSFET 306 will be explained. The first semiconductor layer 500 is formed at first and then the MOSFETs 504 and 506 are formed in the first semiconductor layer 500. In forming the MOSFETs 504 and 506 in the first semiconductor layer 500, a gate insulating film is formed by means of thermal oxidation in the first semiconductor layer 500 to form a first gate electrode. Next, the wiring layer 514 is deposited on the first semiconductor layer 500 to form the metal wires 516 formed out of metal such as aluminum in the wiring layer 514. Then, the second semiconductor layer 508 is deposited on the wiring layer 514 and the MOSFETs 510 and 512 are formed in the second semiconductor layer 508. In forming the MOSFETs 510 and 512 in the second semiconductor layer 508, a gate insulating film is formed by means of radical oxidation or radical nitridation in the second semiconductor layer 508 to form a gate electrode.

Next, the wiring layer 518 is deposited on the second semiconductor layer 508 to form the metal wires 520 formed out of metal such as aluminum in the wiring layer 518. Then, the third semiconductor layer 522 is deposited on the wiring layer 518 and the MOSFETs 524 and 526 are formed in the third semiconductor layer 522. In forming the MOSFETs 524 and 526 in the third semiconductor layer 522, a gate insulating film is formed by means of radical oxidation or radical nitridation in the third semiconductor layer 522 to form a gate electrode. Then, the wiring layer 528 containing the wires 530 is formed. It is noted that the MOSFETs 510 and 512 are formed in the identical position of the second semiconductor layer 508 or the third semiconductor layer 522 so as to have the same structure through the same process by using a same photo mask.

The high-performance multi-layer MOSFET 306 may be fabricated by forming the gate insulating film of the first semiconductor layer 500 by means of the thermal oxidation and the gate insulating film of the second and third semiconductor layers 508 and 522 by means of the radical oxidation or the radical nitridation as described above. That is, the multi-layer MOSFET 306 may not be formed by forming the gate insulating films of the second and third semiconductor layers 508 and 522 by means of thermal oxidation which is a high-temperature (800° C.) process because the wires, e.g., wires formed out of aluminum whose melting point is 660° C., formed in the first and second semiconductor layers 500 and 508 melt. It is noted that although it is conceivable to form the wires by poly-silicon or the like whose fusion point is high in the first and second semiconductor layers 500 and 508, the performance of the multi-layer MOSFET 306 drops because resistance of the wires become high. Then, forming the gate insulating films in the second and third semiconductor layers 508 and 522 by means of the radical oxidation or the radical nitridation of low electron temperature plasma (400° C.) or the like allows the high-performance multi-layer MOSFET 306 to be formed because the wires in the first semiconductor layer 500 may be formed out of metal such as aluminum whose resistance is low.

Because the same photo mask may be repeatedly used by forming the MOSFET 504 or 506 and the MOSFETs 524 and 526 with the same layout pattern at the identical position of the second semiconductor layer 508 or the third semiconductor layer 522, the cost of the mask may be reduced. Still more, because no via-hole needs to be perforated in the second and third semiconductor layers 508 and 522 by providing the wiring layer 514 between the first semiconductor layer 500 and the second semiconductor layer 508 and the wiring layer 518 between the second semiconductor layer 508 and the third semiconductor layer 522, the integration of the circuits may be improved and the circuit area may be reduced.

The insulation of the gate insulating film of the MOSFETs 504 and 506 is almost equal to that of the gate insulating films of the MOSFETs 510, 512, 524 and 526 even if the gate insulating film of the first semiconductor layer 500 is formed by means of the thermal oxidation and the gate insulating film of the second semiconductor layer 508 is formed by means of the radial oxidation or the radial nitridation. It is noted that the performance of the gate insulating film formed by means of the radical oxidation or the radical nitridation as compared to the gate insulating film formed by means of the thermal oxidation will be explained in conjunction with FIGS. 14 through 17.

Meanwhile, when the insulation of the gate insulating film of the MOSFETs 504 and 506 becomes higher than that of the gate insulating film of the MOSFETs 510, 512, 524 and 526 and the insulation of the gate insulating film of the MOSFETs 510 and 512 is almost equalized with that of the gate insulating film of the MOSFETs 524 and 526 by forming the gate insulating film in the first semiconductor layer 500 by means of the thermal oxidation and forming the gate insulating films in the second and third semiconductor layers 508 and 522 by means of the radical oxidation or the radical nitridation, the MOSFETs 504 and 506 may be made smaller than the MOSFETs 510, 512, 524 and 526 and the MOSFETs 510 and 512 may be made almost equally with the MOSFETs 524 and 526 in order to unify the electric characteristics of the MOSFETs 504 and 506 with that of the MOSFETs 510, 512, 524 and 526.

In this case, gate voltage of the MOSFETs 504 and 506 becomes smaller than that of the MOSFETs 510, 512, 524 and 526 and the gate voltage of the MOSFETs 510 and 512 becomes almost equal with that of the MOSFETs 524 and 526. Still more, working speed of the MOSFETs 504 and 506 is higher than that of the MOSFETs 510, 512, 524 and 526 and the working speed of the MOSFETs 510 and 512 is almost equal with that of the MOSFETs 524 and 526.

Then, the multi-layer MOSFET 306 may be operated effectively as a whole by operating the MOSFETs 504 and 506 or the MOSFETs 510, 512, 524 and 526 in accordance to their performance by discriminating signals to be transmitted among the MOSFETs 504 and 506 or the MOSFETs 510, 512, 524 and 526, as follows. For instance, the MOSFETs 504 and 506 whose gate insulating film is formed by means of the thermal oxidation transmit high-frequency signals whose frequency is higher than predetermined frequency and the MOSFETs 510, 512, 524 and 526 whose gate insulating films are formed by means of the radical oxidation or the radical nitridation transmit low-frequency signals whose frequency is lower than the predetermined frequency. In another case, the MOSFETs 504 and 506 whose gate insulating film is formed by means of the thermal oxidation transmit analog signals and the MOSFETs 510, 512, 524 and 526 whose gate insulating films are formed by means of the radical oxidation or the radical nitridation transmit digital signals. It becomes possible to prevent the drop of the performance of the multi-layer MOSFET 306 which is otherwise caused by the drop of performance of the MOSFETs formed by means of the radical oxidation or the radical nitridation by inputting/outputting the different types of signals corresponding to the different performances of the MOSFETs depending on whether the gate insulating films have been formed by the thermal oxidation and the radical oxidation or the radical nitridation.

Figure 12:
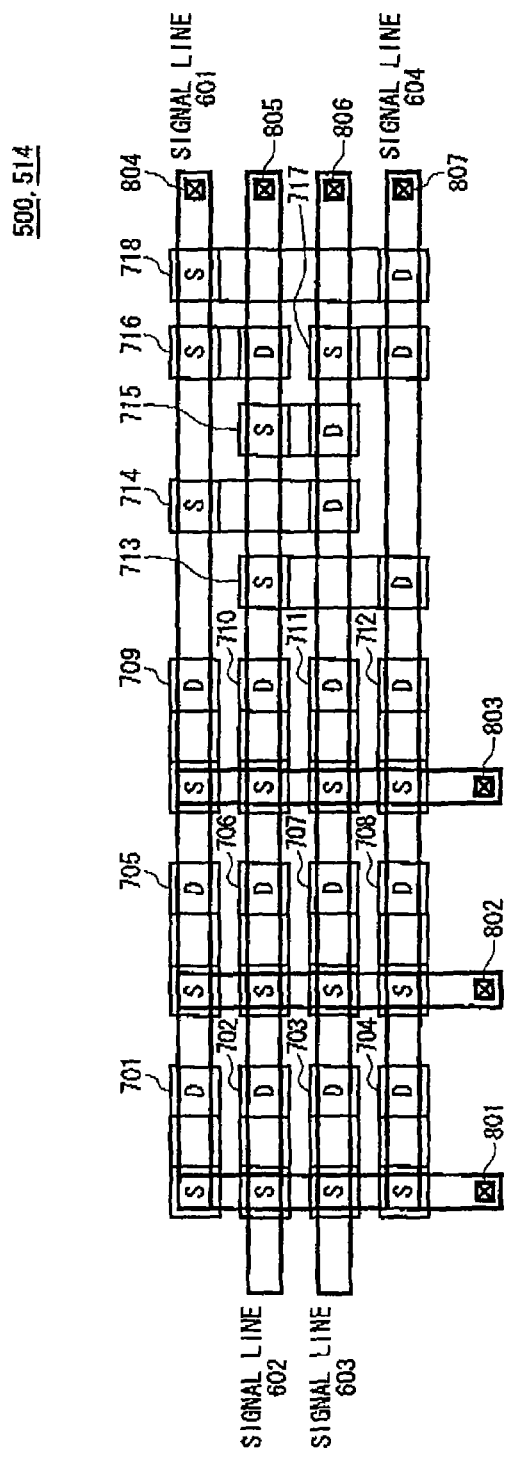
FIG. 12 is a diagrammatic plan view of a first semiconductor layer and a wiring layer.
Figure 13:
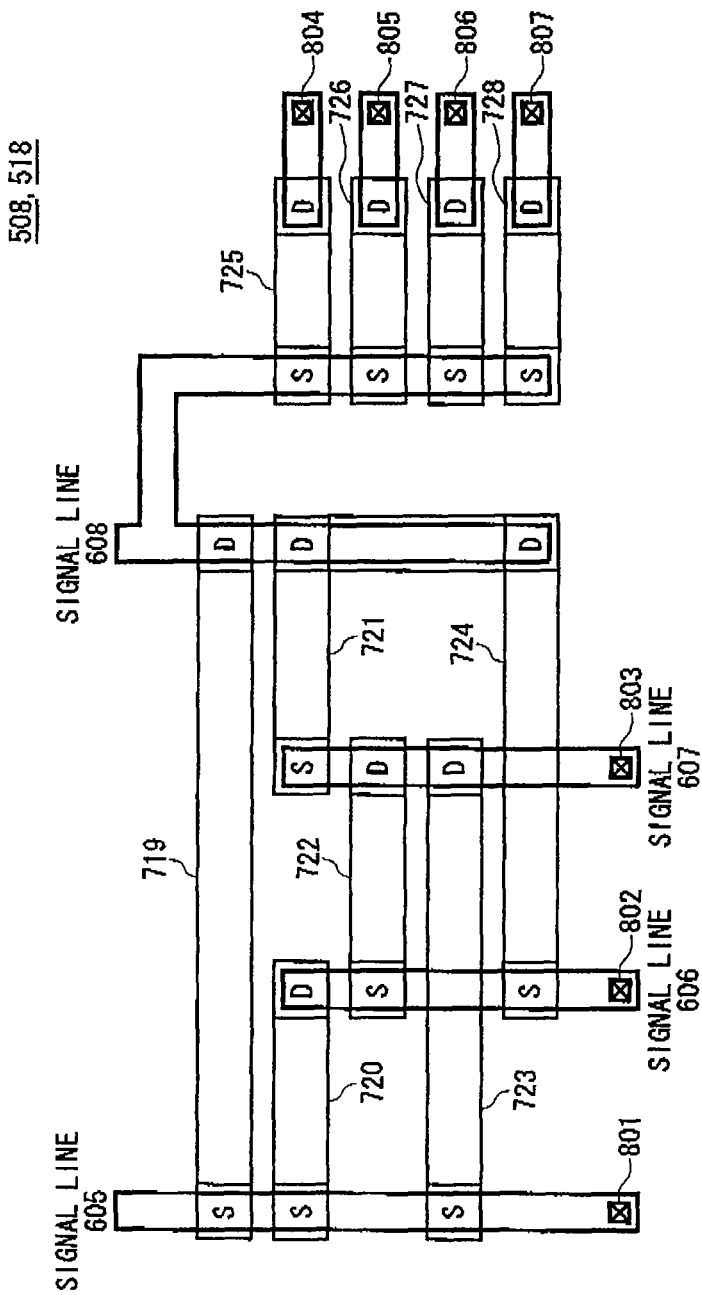
FIG. 13 is a diagrammatic plan view of a second semiconductor layer and a wiring layer.

FIGS. 12 and 13 are diagrammatic plan views showing one exemplary configuration of the multi-layer MOSFET 306 of the second embodiment, wherein FIG. 12 is a plan view of the first semiconductor layer 500 and the wiring layer 514 and FIG. 13 is a diagrammatic plan view of the second semiconductor layer 508 and the wiring layer 518.

MOSFETs 701 through 718 are formed in the first semiconductor layer 500 as shown in FIG. 12 and MOSFETs 719 through 728 are formed in the second semiconductor layer 508 as shown in FIG. 13. The multi-layer MOSFET 306 is a PSM of eight input/outputs for switching connections among a plurality of signal lines 601 through 608. The MOSFETs 701 through 728 are mutually connected by the wires formed in the wiring layers 514 and 518 and by through holes 801 through 807 and switch any one of connections among the plurality of signal lines 601 through 608, respectively.

In concrete, the MOSFET 701 switches the connection between the signal line 601 and the signal line 605, the MOSFET 702 switches the connection between the signal line 602 and the signal line 605, the MOSFET 703 switches the connection between the signal line 603 and the signal line 605, the MOSFET 704 switches the connection between the signal line 604 and the signal line 605, the MOSFET 705 switches the connection between the signal line 601 and the signal line 606, the MOSFET 706 switches the connection between the signal line 602 and the signal line 606, the MOSFET 707 switches the connection between the signal line 603 and the signal line 606, the MOSFET 708 switches the connection between the signal line 604 and the signal line 606, the MOSFET 709 switches the connection between the signal line 601 and the signal line 607, the MOSFET 710 switches the connection between the signal line 602 and the signal line 607, the MOSFET 711 switches the connection between the signal line 603 and the signal line 607, the MOSFET 712 switches the connection between the signal line 604 and the signal line 607, the MOSFET 713 switches the connection between the signal line 602 and the signal line 604, the MOSFET 714 switches the connection between the signal line 601 and the signal line 603, the MOSFET 715 switches the connection between the signal line 602 and the signal line 603, the MOSFET 716 switches the connection between the signal line 601 and the signal line 602, the MOSFET 717 switches the connection between the signal line 603 and the signal line 604 and the MOSFET 718 switches the connection between the signal line 601 and the signal line 604, respectively.

Still more, the MOSFET 719 switches the connection between the signal line 605 and the signal line 608, the MOSFET 720 switches the connection between the signal line 605 and the signal line 606, the MOSFET 721 switches the connection between the signal line 607 and the signal line 608, the MOSFET 722 switches the connection between the signal line 606 and the signal line 607, the MOSFET 723 switches the connection between the signal line 605 and the signal line 607, the MOSFET 724 switches the connection between the signal line 606 and the signal line 608, the MOSFET 725 switches the connection between the signal line 601 and the signal line 608, the MOSFET 726 switches the connection between the signal line 602 and the signal line 608, the MOSFET 727 switches the connection between the signal line 603 and the signal line 608 and the MOSFET 728 switches the connection between the signal line 604 and the signal line 608, respectively.

Figure 1:
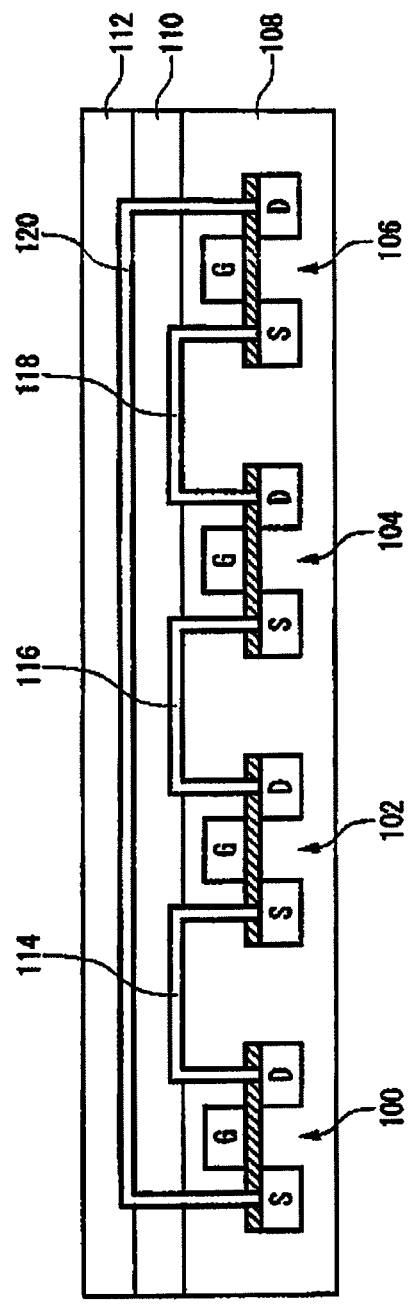
FIG. 1 is a section view of a conventional MOSFET.
Figure 2:
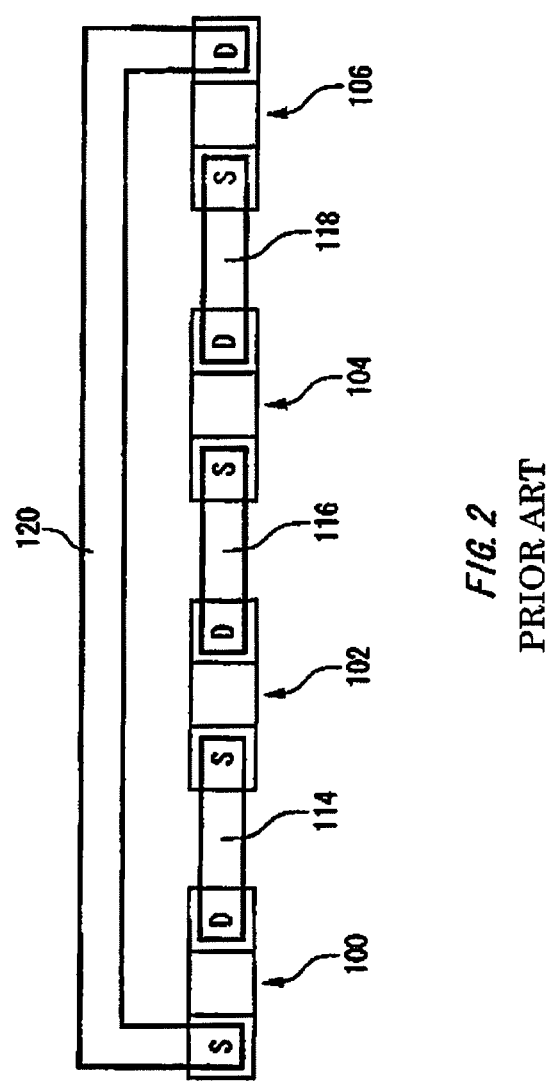
FIG. 2 is a plan view of the conventional MOSFET.
Figure 3:
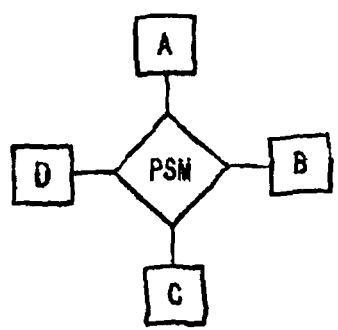
FIG. 3 is a conceptual diagram of a conventional programmable circuit.
Figure 4:
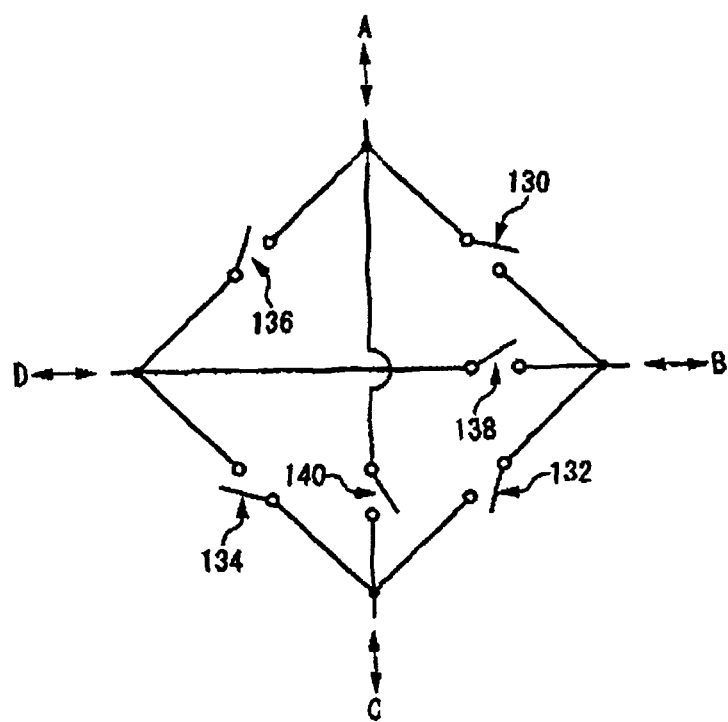
FIG. 4 shows a circuit configuration of a conventional PSM.
Figure 5:
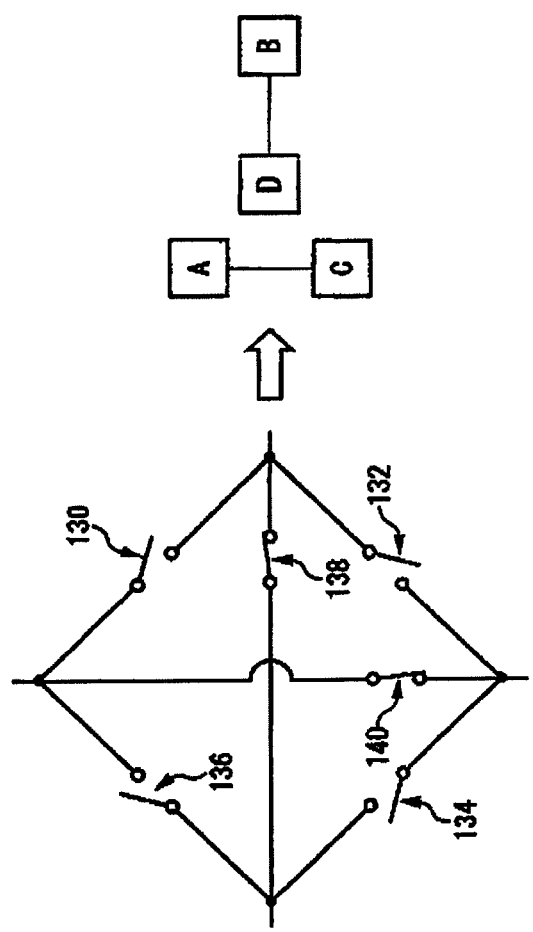
FIG. 5 shows a circuit configuration of the conventional PSM.
Figure 6:
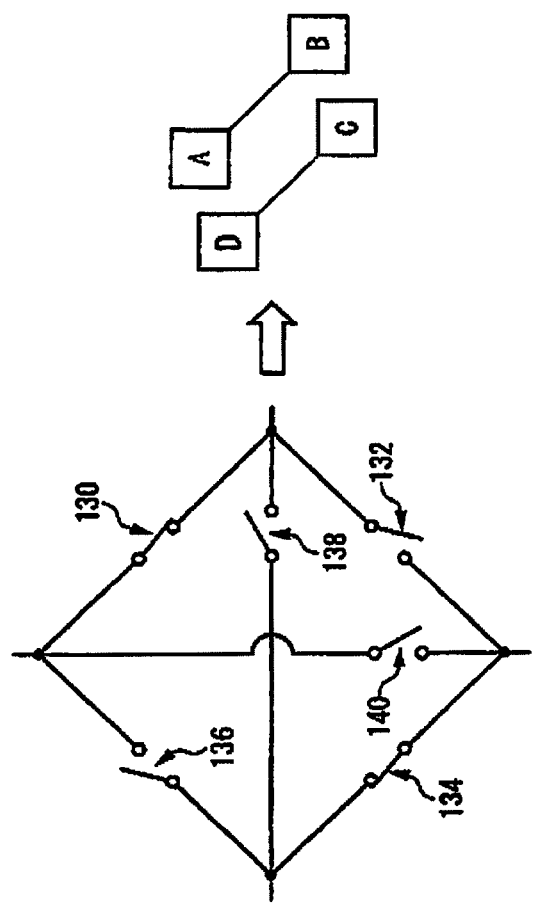
FIG. 6 shows a circuit configuration of the conventional PSM.
Figure 7:
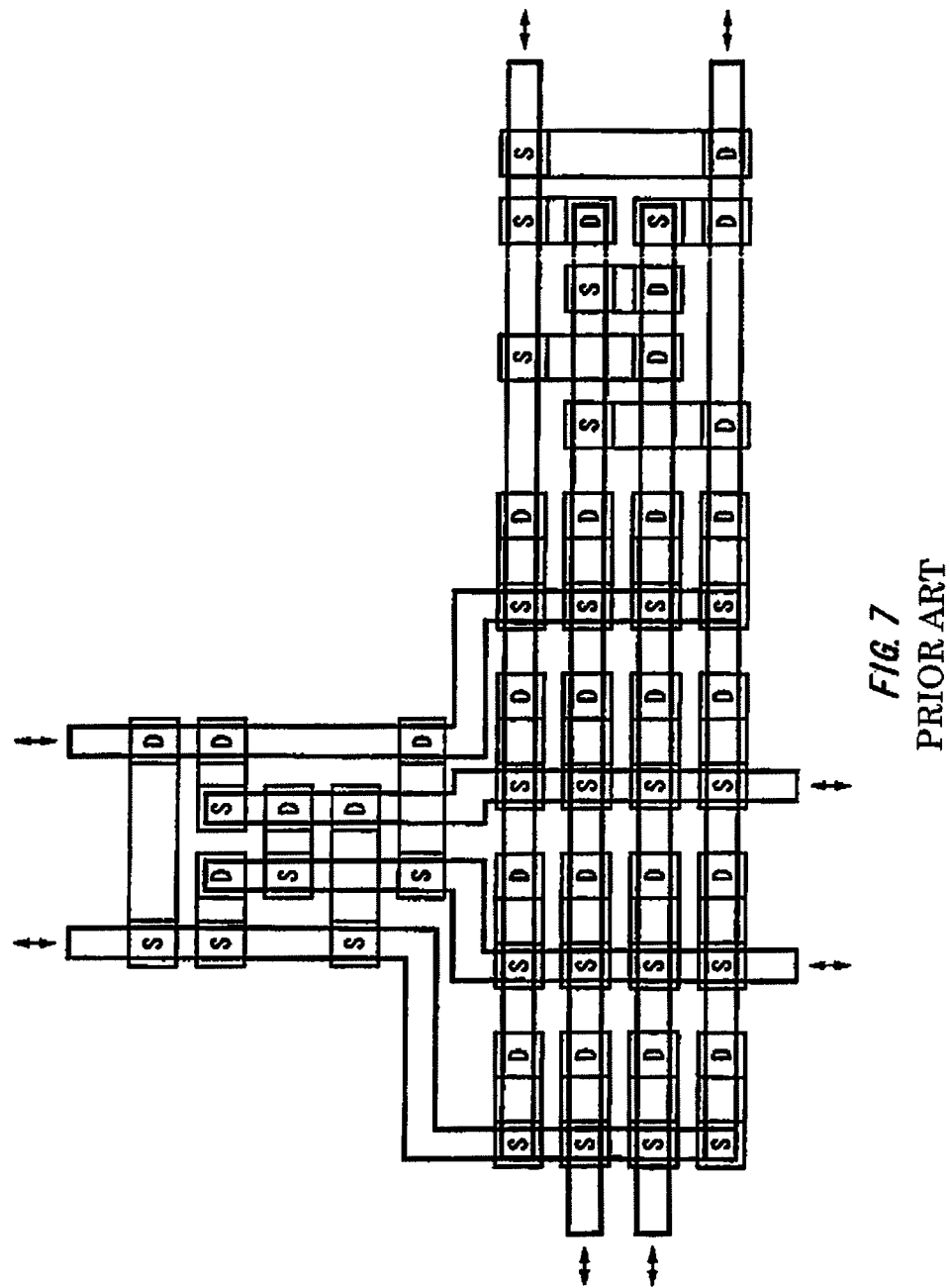
FIG. 7 is a diagrammatic plan view of the PSM having eight input/outputs.

As it is apparent from the comparison with the conventional PSM of eight input/outputs shown in FIG. 7, the circuit area of the multi-layer MOSFET 306 may be reduced by constructing the multi-layer MOSFET 306 by dividing the MOSFETs 701 through 728 into the first and second semiconductor layers 500 and 508 and by stacking them as described above. Because a chip area may be reduced, wiring length may be shortened as well. As a result, a wire delay time is reduced and the circuit may be operated at high-speed.

Still more, when the MOSFETs 719 through 728 become larger than the MOSFETs 701 through 718 by forming gate insulating films of the MOSFETs 701 through 718 in the first semiconductor layer 500 by means of the thermal oxidation and by forming gate insulating films of the MOSFETs 719 through 728 in the second semiconductor layer 508 by means of the radical oxidation or the radical nitridation as explained in conjunction with FIGS. 10 and 11, the number of the MOSFETs formed in the second semiconductor layer 508 is preferred to be smaller than the number of the MOSFETs formed in the first semiconductor layer 500. Because it allows the area of the circuit formed in the first semiconductor layer 500 to be equalized almost with that of the circuit formed in the second semiconductor layer 508, the chip area of the multi-layer MOSFET 306 may be reduced.

Figure 14:
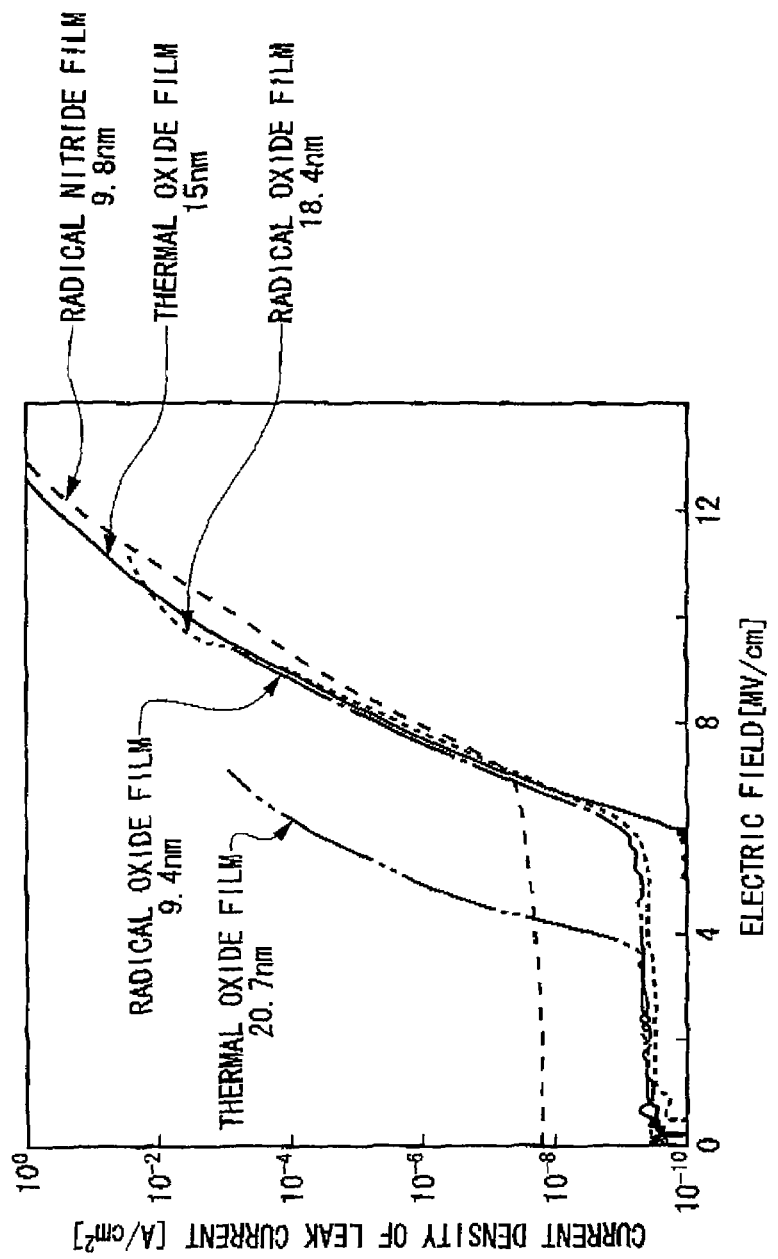
FIG. 14 is a graph showing the relationship between electric field applied to a gate insulating film and a leak current.

FIG. 14 is a graph showing the relationship between electric field applied to the gate insulating film and current density of a leak current. Its axis of abscissa represents the electric field (MV/cm) applied to the gate insulating film and its axis of ordinate represents the current density ($A/cm^2$) of the leak current. The graph shows the case when the degrees of the leak current of the gate insulating film formed by means of the thermal oxidation (thermal oxide film: 20.7 nm in thickness), the gate insulating film formed by means of the thermal oxidation (thermal oxide film, 15 nm in thickness), the gate insulating film formed by means of the radical oxidation (radical oxide film; 18.4 nm in thickness), the gate insulating film formed by means of the radical oxidation (radical oxide film: 9.4 nm in thickness) and the gate insulating film formed by means of the radical nitridation (radical nitride film: 9.8 nm in thickness) are compared.

As shown in FIG. 14, the leak current of the radical oxide film is almost equal to or smaller than the leak current of the thermal oxide film. Further, the leak current of the radical nitride film is smaller than the leak current of the thermal oxide film whose thickness is 20.7 nm when the electric field is greater than about 4 (MV/cm) and is smaller than the leak current of the thermal oxide film whose thickness is 15 nm when the electric field is greater than about 7 (MV/cm). Accordingly, the higher-performance MOSFET may be formed even when the gate insulating film is formed by means of the radical oxidation or the radical nitridation as compared to the case of forming the gate insulating film by means of the thermal oxidation.

Figure 15:
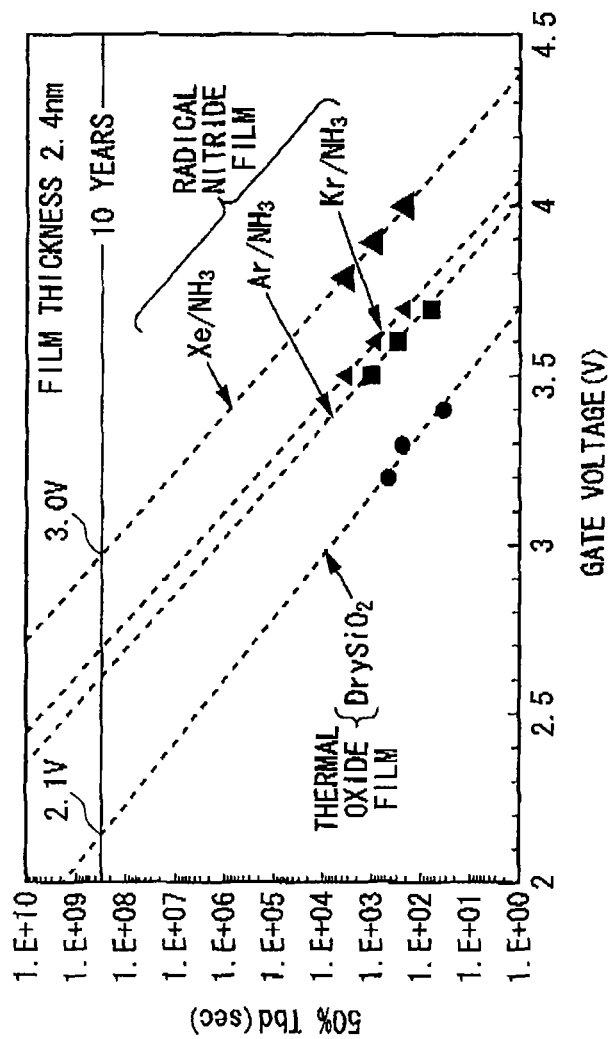
FIG. 15 is a graph showing the relationship between gate voltage and a life of the gate insulating film.

FIG. 15 is a graph showing the relationship between gate voltage and a life of the gate insulating film. Its axis of abscissa represents the gate voltage and its axis of ordinate represents a time (life) until when a half of number of the gate insulating films is broken down under the TDDB (time dependent dielectric breakdown) test. The life of the thermal oxide film (Dry $SiO_2$) formed by means of the thermal oxidation is compared with that of the radical oxide film ($Xe/NH_3$, $Ar/NH_3$, $Kr/NH_3$) formed by means of the radical nitridation. It is noted that the graph shows a case when the thickness of the thermal oxide film and the radical nitride film is 2.4 nm.

As shown in FIG. 15, the life of the radical nitride film becomes 30,000 times of that of the thermal oxide film in some cases. Still more, when the life of the thermal oxide film (Dry $SiO_2$) and that of the radical oxide film ($Xe/NH_3$) formed by means of the radical nitridation by xenon plasma are set at 10 years for example, while 2.1 V may be applied as the gate voltage in case of the thermal oxide film ((Dry $SiO_2$), 3.0 V may be applied as the gate voltage in case of the radical nitride film ($Xe/NH_3$). Accordingly, the MOSFET whose working speed is high may be formed by forming the gate insulating film by means of the radical nitridation as compared to the case of forming the gate insulating film by means of the thermal oxidation.

Figure 16:
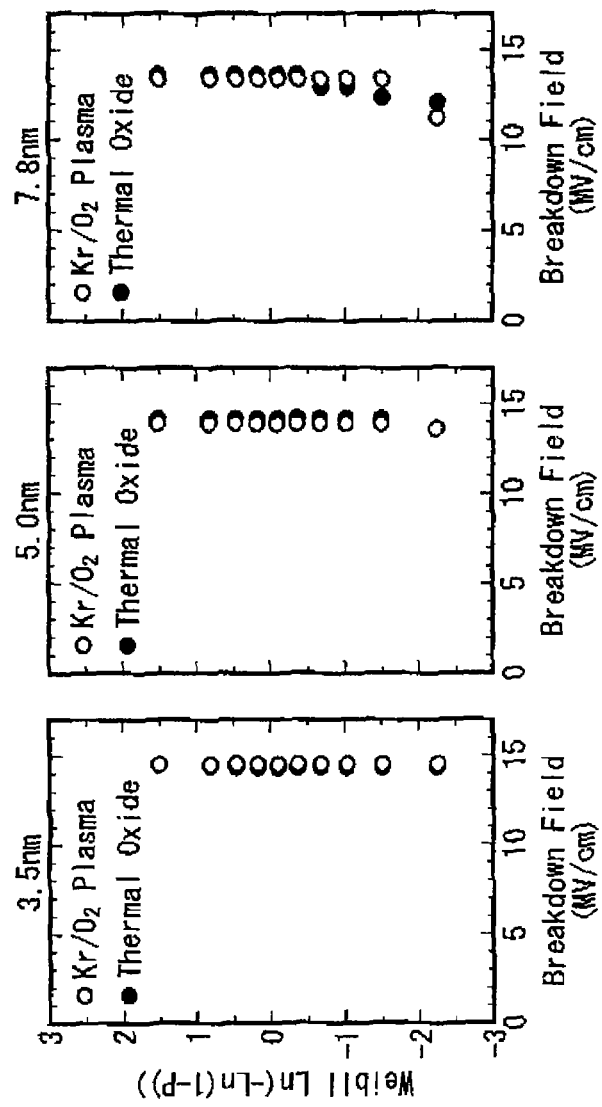
FIG. 16 is a graph showing the distribution of the breakdown field intensity of the gate insulating film.

FIG. 16 is a graph showing the distribution of the breakdown field intensity of the gate insulating film. Its axis of ordinate represents Weibull distribution and its axis of abscissa represents the electric field (Breakdown Field) (MV/cm) applied to the gate insulating film. Here, the Weibull distribution is set at 0 when the probability of causing dielectric breakdown when predetermined voltage is applied is 50%. As a result of experiment on the three kinds of thickness of 3.5 nm, 5.0 nm and 7.8 nm, the gate insulating films formed by means of the radical oxidation by using krypton plasma in low electron temperature present the breakdown field intensity almost equal to that of the gate insulating film formed by means of the thermal oxidation in all of the three kinds of thickness. Accordingly, it may be understood that the high quality gate insulating film may be formed even in the low electronic temperature (400° C.).

Figure 17:
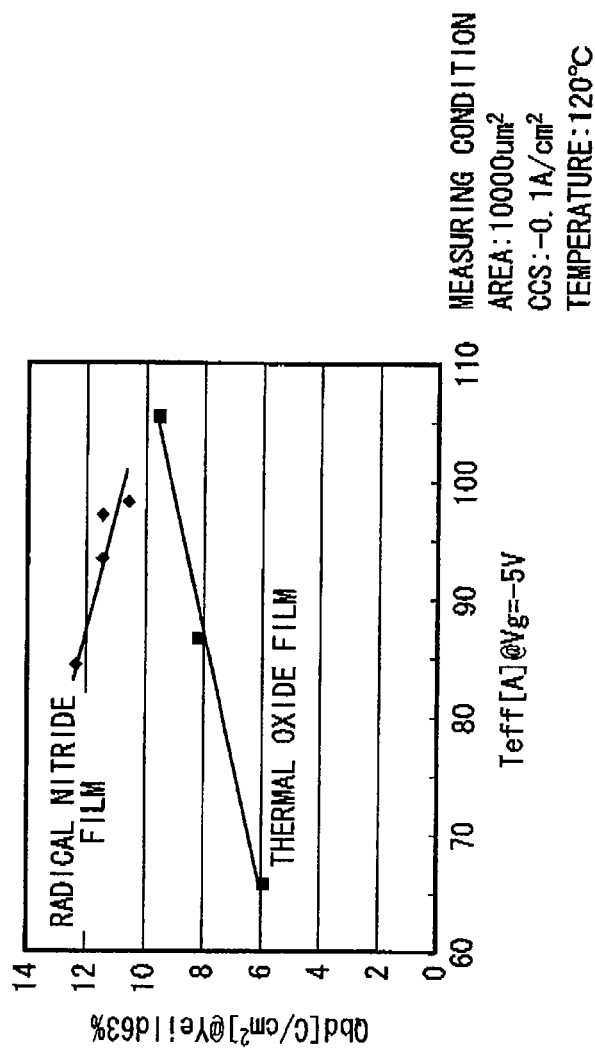
FIG. 17 is a graph showing the relationship between a thickness of the gate insulating film and electric charge causing breakdown of the gate insulating film.

FIG. 17 is a graph showing the relationship between the thickness of the gate insulating film and electric charge Qbd causing the dielectric breakdown. Here, (the electric charge Qdb causing the breakdown)=(fixed current)×(a time till causing the breakdown). This is one of indices of reliability of the gate insulating film. The axis of abscissa represents the effective thickness of the gate insulating film and the axis of ordinate represents the electric charge Qdb when the yield is 63%. Thermal oxide film formed by means of the thermal oxidation is compared with the radical oxide film formed by means of the radical oxidation.

As shown in FIG. 17, when the effective thickness of the gate insulating film is thin (Teff<100 Å), the reliability of the radical oxide film in terms of the Qdb index becomes about 1.5 times of that of the thermal oxide film. This means that the radical oxide film is less liable to be broken down than the thermal oxide film. Accordingly, the MOSFET having the long life may be formed by forming the gate insulating film by means of the radical oxidation as compared to the case of forming the gate insulating film by means of the thermal oxidation.

Figure 18:
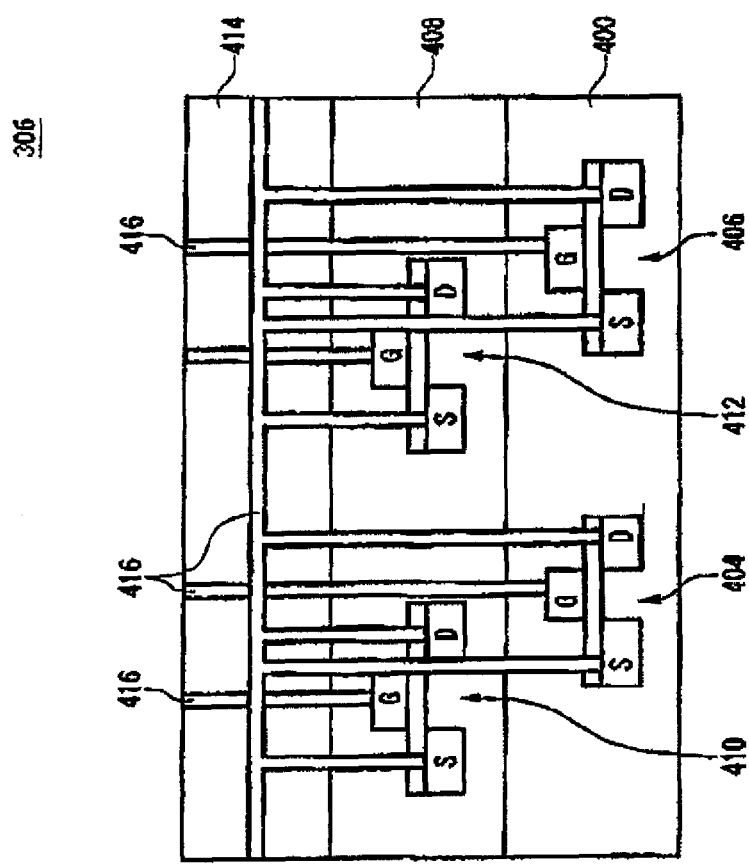
FIG. 18 shows a circuit configuration in accordance with one or more embodiments of the invention.
Figure 19:
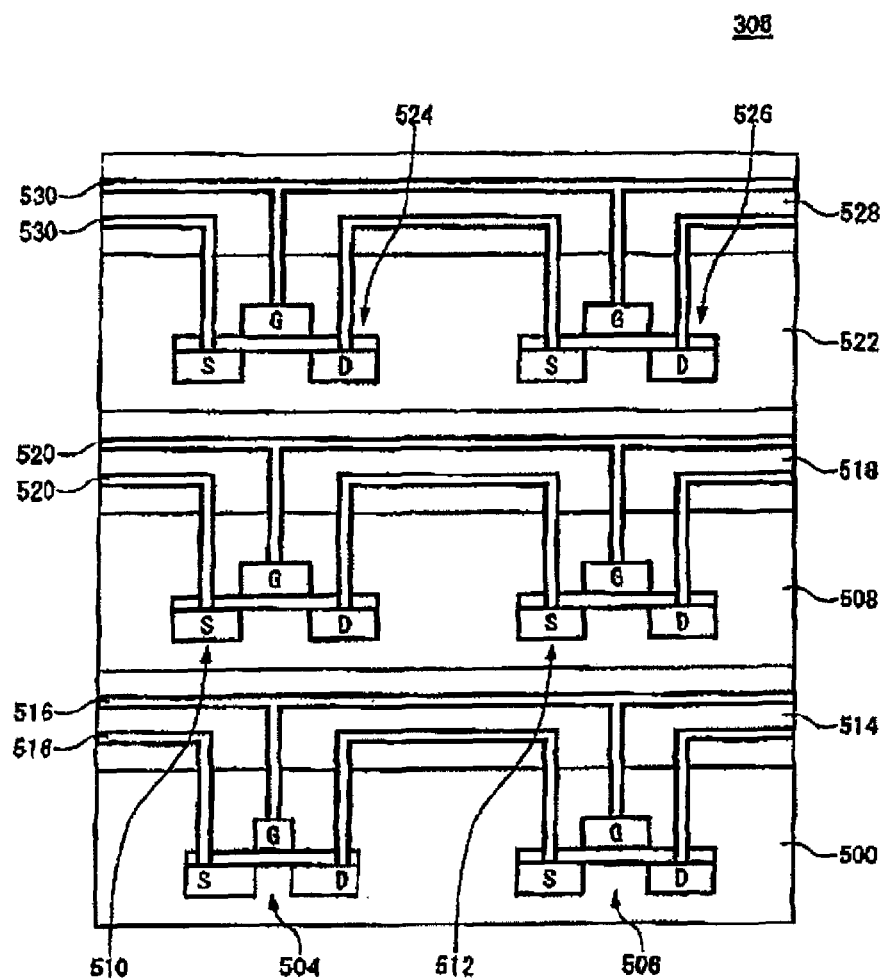
FIG. 19 shows a circuit configuration in accordance with one or more embodiments of the invention.

As one of ordinary skill in the art would recognize in view of the present disclosure, in accordance with one or more embodiments of the present disclosure, FIGS. 18-19 show examples of a semiconductor integrated circuit having a multilayer structure comprising a first semiconductor layer transistor and a second semiconductor layer transistor, wherein said second semiconductor layer transistor is formed in such a manner that the size of the gate insulating film in said second semiconductor layer is larger than the size of the gate insulating film in said first semiconductor layer transistor. Furthermore, the description of the respective elements shown in FIGS. 18-19 are identical to those described above in reference to FIGS. 10 and 11, respectively.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A method of manufacturing a semiconductor integrated circuit having a multi-layer structure, comprising:
    forming a first semiconductor layer transistor in a first semiconductor layer;
    depositing a second semiconductor layer on said first semiconductor layer; and
    forming a second semiconductor layer transistor in said second semiconductor layer, wherein said forming said second semiconductor layer transistor comprises:
        forming a source electrode and a drain electrode in said second semiconductor layer;
        forming a second semiconductor layer gate insulating film in said second semiconductor layer by at least one of radical oxidation and radical nitridation; and
        forming a gate electrode in said second layer, and
    said forming said first semiconductor layer transistor in said first semiconductor layer comprises forming a first semiconductor layer gate insulating film in said first semiconductor layer by thermal oxidation,
    wherein a size of said second semiconductor layer gate insulating film is larger than a size of said first semiconductor layer gate insulating film so that (i) an insulation of said second semiconductor layer gate insulating film is almost equalized with an insulation of said first semiconductor layer gate insulating film; and (ii) the electric characteristics of the first semiconductor transistor and the second semiconductor transistor are unified.

2. The method of claim 1, further comprising:
forming a wiring connected to said first semiconductor layer transistor; wherein a processing temperature of said at least one of the radical oxidation and the radical nitridation is lower than a melting temperature of said wiring connected to said first semiconductor layer transistor.

3. The method of claim 1, wherein
said forming said gate insulating film in said second semiconductor layer comprises using a low electron temperature plasma.

4. The method of claim 1, wherein
a process temperature of the thermal oxidation is higher than that of said at least one of the radical oxidation and the radical nitridation.

5. The method of claim 1, further comprising:
depositing a third semiconductor layer on said second semiconductor layer; and
forming a third semiconductor layer transistor in said third semiconductor layer, wherein
said forming said third semiconductor layer transistor comprises forming a third layer gate insulating film in said third semiconductor layer by at least one of radical oxidation and radical nitridation.

6. The method of claim 5, wherein
said second semiconductor layer transistor and said third semiconductor layer transistor are formed by identical processes using the same photo-mask.

7. The method of claim 6, further comprising:
forming a first wiring layer between said first and second semiconductor layers; and
forming a second wiring layer between said second and third semiconductor layers.

* * * * *